United States Patent
Lin et al.

(10) Patent No.: US 9,202,713 B2
(45) Date of Patent: Dec. 1, 2015

(54) SEMICONDUCTOR DEVICE AND METHOD OF FORMING RDL OVER CONTACT PAD WITH HIGH ALIGNMENT TOLERANCE OR REDUCED INTERCONNECT PITCH

(75) Inventors: Yaojian Lin, Singapore (SG); Kang Chen, Singapore (SG); Jianmin Fang, Singapore (SG); Xia Feng, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 11 days.

(21) Appl. No.: 13/181,412

(22) Filed: Jul. 12, 2011

(65) Prior Publication Data

US 2012/0018874 A1    Jan. 26, 2012

Related U.S. Application Data

(60) Provisional application No. 61/367,814, filed on Jul. 26, 2010.

(51) Int. Cl.
*H01L 23/48* (2006.01)
*H01L 21/56* (2006.01)
(Continued)

(52) U.S. Cl.
CPC .............. *H01L 21/561* (2013.01); *H01L 24/03* (2013.01); *H01L 24/05* (2013.01); *H01L 24/11* (2013.01); *H01L 23/3114* (2013.01); *H01L 23/3192* (2013.01); *H01L 24/13* (2013.01); *H01L 24/48* (2013.01); *H01L 2224/024* (2013.01); *H01L 2224/0239* (2013.01); *H01L 2224/02311* (2013.01); *H01L 2224/02321* (2013.01); *H01L 2224/02375* (2013.01); *H01L 2224/02379* (2013.01); *H01L 2224/02381* (2013.01); *H01L 2224/0345* (2013.01); *H01L 2224/0346* (2013.01); *H01L 2224/03452* (2013.01); *H01L 2224/03464* (2013.01); *H01L 2224/0401* (2013.01); *H01L 2224/04042* (2013.01); *H01L 2224/05548* (2013.01); *H01L 2224/05558* (2013.01); *H01L 2224/05611* (2013.01); *H01L 2224/05624* (2013.01); *H01L 2224/05639* (2013.01); *H01L 2224/05644* (2013.01);
(Continued)

(58) Field of Classification Search
CPC ................. H01L 2924/00014; H01L 2924/00; H01L 2224/45147; H01L 2924/01029; H01L 2924/00012
USPC .................... 257/773, 734, E21.159, E23.01; 438/622
See application file for complete search history.

(56) References Cited

U.S. PATENT DOCUMENTS 4,617,193 A * 10/1986 Wu ............................... 438/631
4,916,521 A * 4/1990 Yoshikawa et al. ........... 257/412
(Continued)

*Primary Examiner* — Andy Huynh
(74) *Attorney, Agent, or Firm* — Robert D. Atkins; Atkins and Associates, P.C.

(57) ABSTRACT

A semiconductor device has a semiconductor die with an active surface. A first conductive layer is formed over the active surface. A first insulating layer is formed over the active surface. A second insulating layer is formed over the first insulating layer and first conductive layer. A portion of the second insulating layer is removed over the first conductive layer so that no portion of the second insulating layer overlies the first conductive layer. A second conductive layer is formed over the first conductive layer and first and second insulating layers. The second conductive layer extends over the first conductive layer up to the first insulating layer. Alternatively, the second conductive layer extends across the first conductive layer up to the first insulating layer on opposite sides of the first conductive layer. A third insulating layer is formed over the second conductive layer and first and second insulating layers.

30 Claims, 14 Drawing Sheets

(51) Int. Cl.
*H01L 23/00* (2006.01)
*H01L 23/31* (2006.01)

(52) U.S. Cl.
CPC ............. *H01L2224/05647* (2013.01); *H01L 2224/05655* (2013.01); *H01L 2224/1132* (2013.01); *H01L 2224/1145* (2013.01); *H01L 2224/1146* (2013.01); *H01L 2224/11334* (2013.01); *H01L 2224/11464* (2013.01); *H01L 2224/11849* (2013.01); *H01L 2224/11901* (2013.01); *H01L 2224/13022* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16225* (2013.01); *H01L 2224/16227* (2013.01); *H01L 2224/48091* (2013.01); *H01L 2224/73265* (2013.01); *H01L 2924/014* (2013.01); *H01L 2924/0105* (2013.01); *H01L 2924/01005* (2013.01); *H01L 2924/01006* (2013.01); *H01L 2924/01013* (2013.01); *H01L 2924/01029* (2013.01); *H01L 2924/01047* (2013.01); *H01L 2924/01049* (2013.01); *H01L 2924/01073* (2013.01); *H01L 2924/01078* (2013.01); *H01L 2924/01079* (2013.01); *H01L 2924/01082* (2013.01); *H01L 2924/01322* (2013.01); *H01L 2924/12041* (2013.01); *H01L 2924/1306* (2013.01); *H01L 2924/13091* (2013.01)

(56) References Cited

U.S. PATENT DOCUMENTS

| | | | | |
|---|---|---|---|---|
| 5,856,705 | A | * | 1/1999 | Ting ............................ 257/758 |
| 6,522,021 | B2 | | 2/2003 | Sakihama et al. |
| 6,753,609 | B2 | | 6/2004 | Chien et al. |
| 7,091,121 | B2 | | 8/2006 | Horng |
| 7,276,797 | B2 | * | 10/2007 | Fan et al. .................... 257/774 |
| 7,528,069 | B2 | | 5/2009 | Wenzel et al. |
| 2003/0218246 | A1 | * | 11/2003 | Abe et al. .................... 257/734 |
| 2005/0017343 | A1 | * | 1/2005 | Kwon et al. ................. 257/698 |
| 2009/0283905 | A1 | * | 11/2009 | Huang et al. ................ 257/737 |
| 2010/0171194 | A1 | | 7/2010 | Lin et al. |
| 2011/0115050 | A1 | * | 5/2011 | Lin ............................... 257/532 |
| 2011/0221055 | A1 | * | 9/2011 | Lin et al. ..................... 257/692 |
| 2011/0221057 | A1 | * | 9/2011 | Lin et al. ..................... 257/734 |
| 2012/0175735 | A1 | * | 7/2012 | Lin ............................... 257/532 |

* cited by examiner

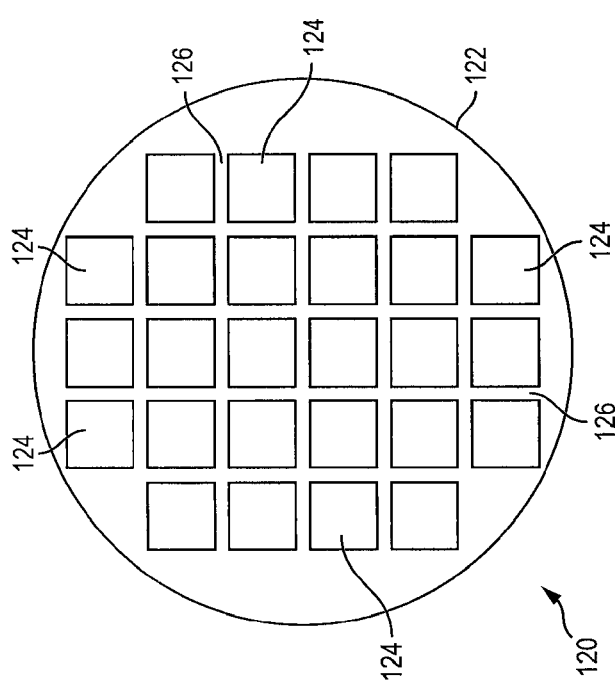
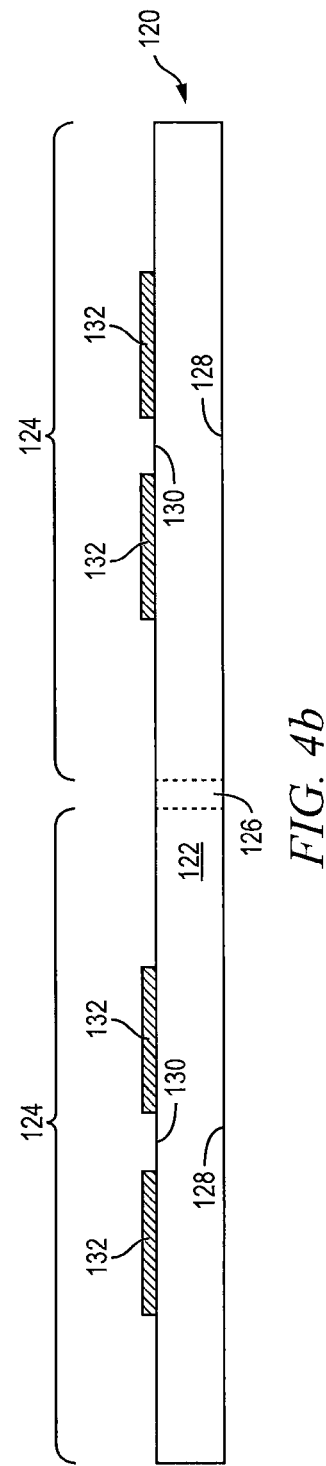
FIG. 4a
FIG. 4b

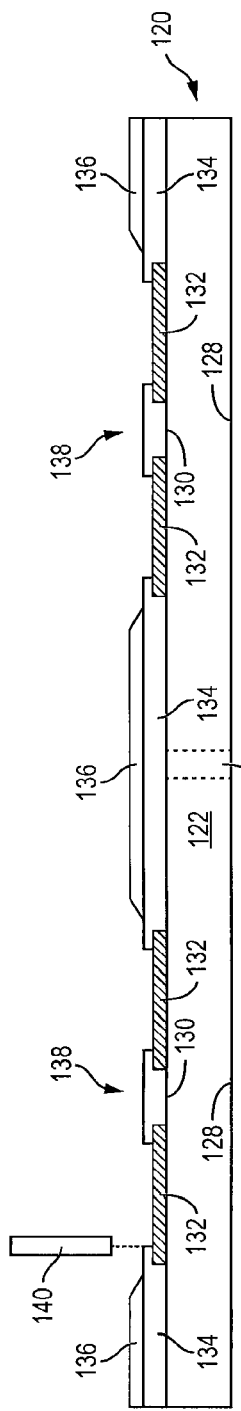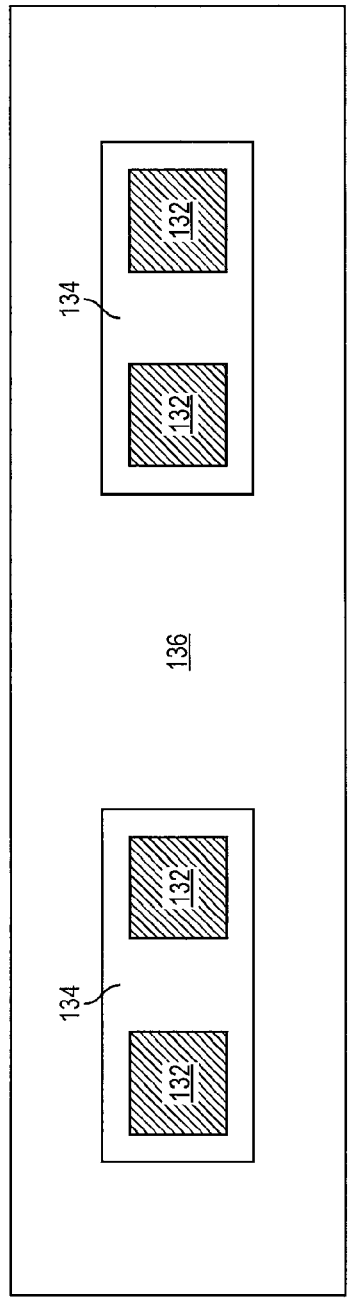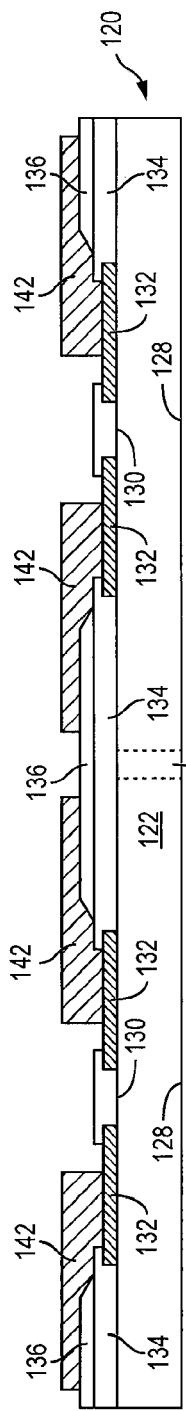

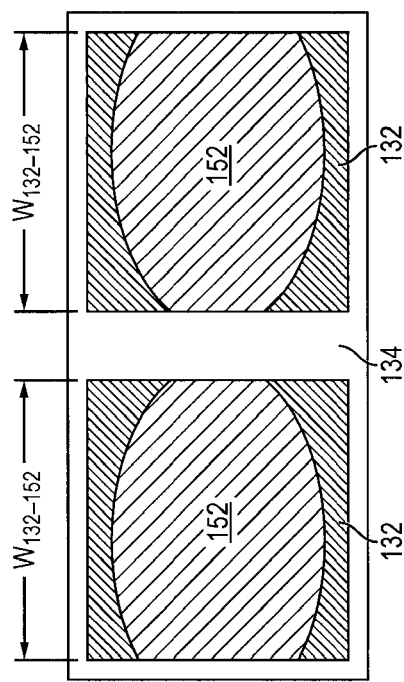
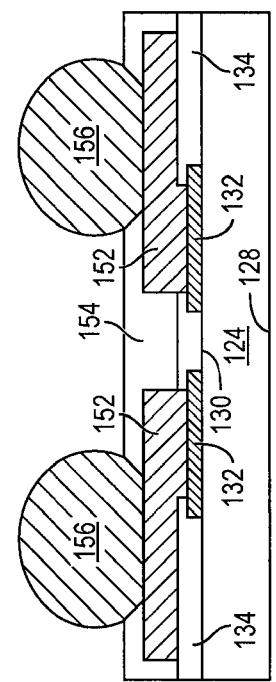
FIG. 7b
FIG. 8

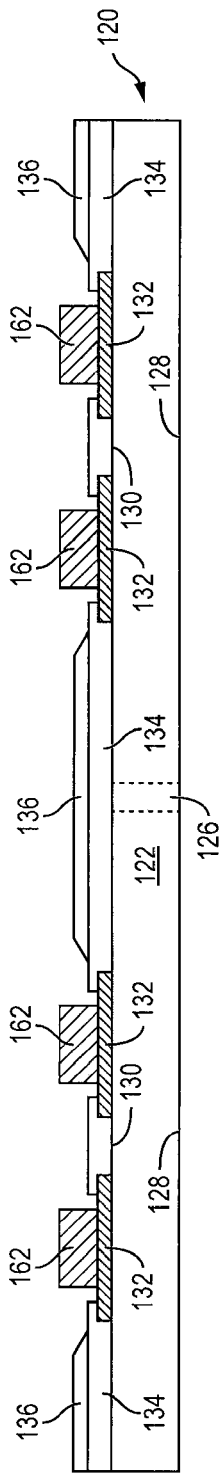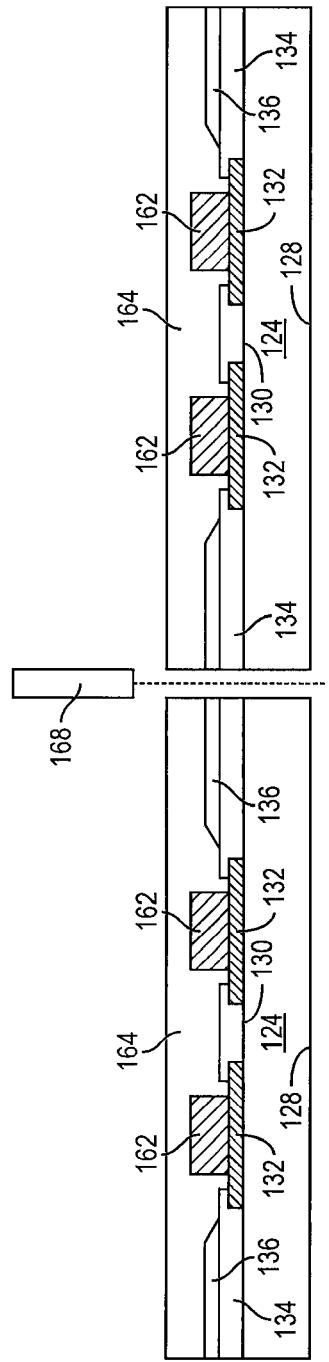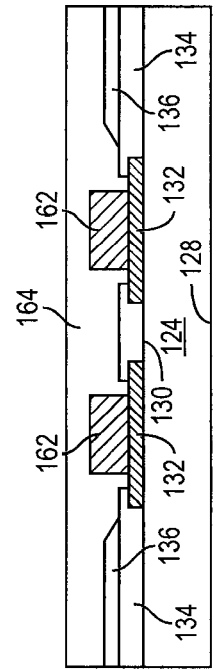
FIG. 9a
FIG. 9b
FIG. 10a

SEMICONDUCTOR DEVICE AND METHOD OF FORMING RDL OVER CONTACT PAD WITH HIGH ALIGNMENT TOLERANCE OR REDUCED INTERCONNECT PITCH

CLAIM TO DOMESTIC PRIORITY

The present application claims priority to Provisional Application No. 61/367,814, filed Jul. 26, 2010, and claims priority to the above application pursuant to 35 U.S.C. §120.

FIELD OF THE INVENTION

The present invention relates in general to semiconductor devices and, more particularly, to a semiconductor device and method of forming an RDL over a contact pad with a high alignment tolerance or reduced interconnect pitch.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CODs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current, or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

FIG. 1a illustrates a conventional semiconductor device 10 with semiconductor die or wafer 12 in a fan-in or fan-out wafer level chip scale package (WLCSP). Semiconductor die 12 has an active surface 14 and contact pads 16 formed on the active surface. An insulating or passivation layer 18 is formed at the wafer level over active surface 14 and contact pads 16. A portion of insulating layer 18 is removed by an etching process to expose contact pads 16. An insulating or passivation layer 20 is formed at the wafer level over insulating layer 18 and the exposed contact pads 16. A portion of insulating layer 20 is removed by an etching process to expose contact pads 16. The opening in insulating layer 18 is typically 20 micrometers (μm) in order to have good contact characteristics to contact pads 16. An electrically conductive layer 22 is formed over the exposed contact pads 16 and insulating layer 20. Conductive layer 22 operates as a redistribution layer (RDL) electrically connected to contact pads 16. Conductive layer 22 extends beyond the opening in insulating layer 20 to laterally redistribute the electrical interconnect to contact pad 16. An insulating or passivation layer 24 is formed over insulating layer 20 and conductive layer 22. A portion of insulating layer 24 is removed by an etching process to expose conductive layer 22 for electrical interconnect.

FIG. 1b shows a plan view of semiconductor device 10, taken along line 1b-1b of FIG. 1a with focus on contact pad area 26. The width of opening 28 in insulating layer 20 to expose contact pad 16 for deposition of conductive layer 22 and, accordingly, the width $W_{16\text{-}22}$ of the contact surface area between conductive layer 22 and contact pad 16 is 20 μm. The width between adjacent conductive layers 22 is 10 μm. An opening width $W_{16\text{-}22}$ of 20 μm is necessary for good electrical characteristics between conductive layer 22 and contact pads 16. However, due to the overlap of insulating layer 20 over contact pad 16 completely around the contact pad, a certain width and pitch of contact pad 16 is required to maintain the interconnect surface area between conductive layer 22 and contact pad 16. In one embodiment, a width of contact pads 16 is 45 μm, and the contact pad pitch is 50 μm. For a 10 μm overlap of insulating layer 20 over conductive layer 16 around opening 28, the width $W_{20\text{-}20}$ is 20+10+10=40 μm. The contact pad pitch of 50 μm becomes a process limitation due to the width $W_{20\text{-}20}$ (width of opening 28 plus overlap width) needed for good contact characteristics. If the width $W_{16\text{-}22}$ of opening 28 is reduced further, then the contact characteristics between conductive layer 22 and contact pad 16 are diminished.

SUMMARY OF THE INVENTION

A need exists to form an RDL over a contact pad with a high alignment tolerance and fine interconnect pitch. Accordingly, in one embodiment, the present invention is a method of making a semiconductor device comprising the steps of providing a semiconductor die having an active surface, forming a first conductive layer over the active surface of the semiconductor die, forming a first insulating layer over the active surface of the semiconductor die, forming a second insulating layer over the first insulating layer and first conductive layer, removing a portion of the second insulating layer over the first conductive layer so that no portion of the second insulating layer overlies the first conductive layer, forming a second conductive layer over the first conductive layer and first and second insulating layers, and forming a third insulating layer over the second conductive layer and first and second insulating layers.

In another embodiment, the present invention is a method of making a semiconductor device comprising the steps of providing a semiconductor die, forming a first conductive layer over a surface of the semiconductor die, forming a first insulating layer over the first conductive layer and surface of the semiconductor die, removing a portion of the first insulating layer over the first conductive layer so that no portion of the first insulating layer overlies the first conductive layer, forming a second conductive layer over the first conductive layer and first insulating layers, and forming a second insulating layer over the second conductive layer and first insulating layer.

In another embodiment, the present invention is a method of making a semiconductor device comprising the steps of providing a semiconductor die, forming a first conductive layer over a surface of the semiconductor die, forming a first insulating layer over the surface of the semiconductor die, forming a second conductive layer that extends across the first conductive layer up to the first insulating layer on opposite sides of the first conductive layer, and forming a second insulating layer over the second conductive layer and first insulating layer.

In another embodiment, the present invention is a semiconductor device comprising a semiconductor die and first conductive layer formed over a surface of the semiconductor die. A first insulating layer is formed over the surface of the semiconductor die. A second conductive layer extends across the first conductive layer up to the first insulating layer on opposite sides of the first conductive layer. A second insulating layer is formed over the second conductive layer and first insulating layer.

BRIEF DESCRIPTION OF THE DRAWINGS

FIGS. 4a-4j illustrate a process of forming an RDL over a contact pad with a high alignment tolerance;

FIGS. 7a-7b illustrate the semiconductor die with the RDL formed over the contact pad according to FIGS. 6a-6c;

FIG. 8 illustrates another embodiment of the semiconductor die with the RDL over the contact pad;

FIGS. 9a-9b illustrate another process of forming an RDL formed over a contact pad with a high alignment tolerance and reduced interconnect pitch;

FIGS. 10a-10c illustrate the semiconductor die with the RDL over the contact pad according to FIGS. 9a-9b;

DETAILED DESCRIPTION OF THE DRAWINGS

Figure 1A:
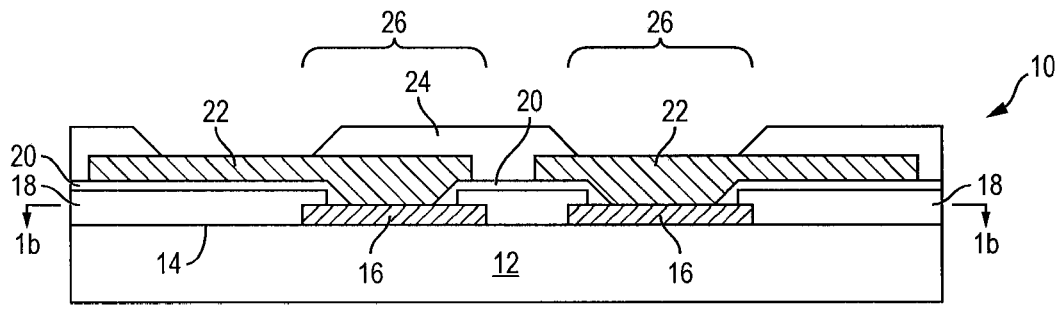
FIGS. 1a-1b shows a conventional semiconductor die mounted to a substrate with an electrical bridge defect.
Figure 1B:
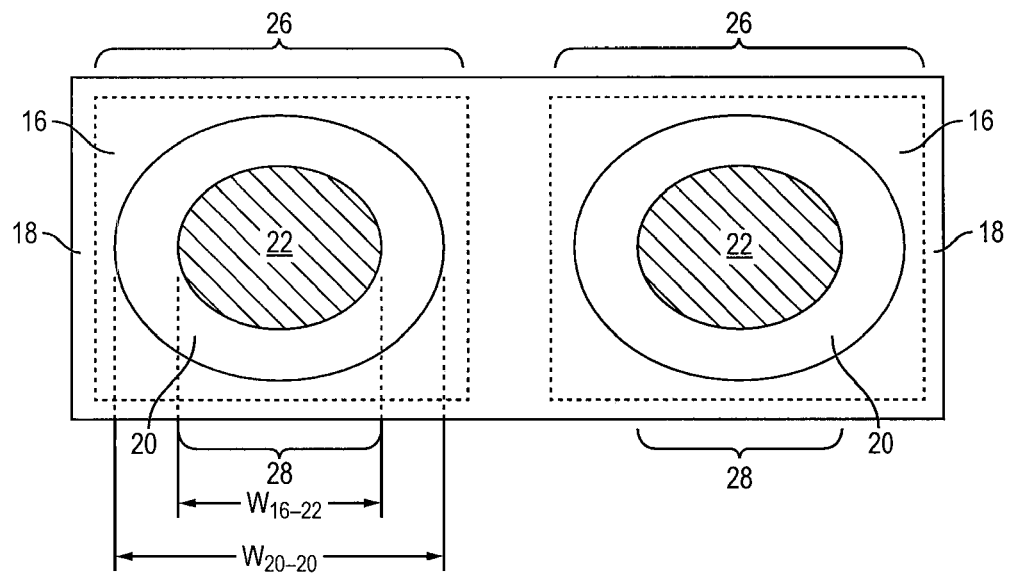

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2:
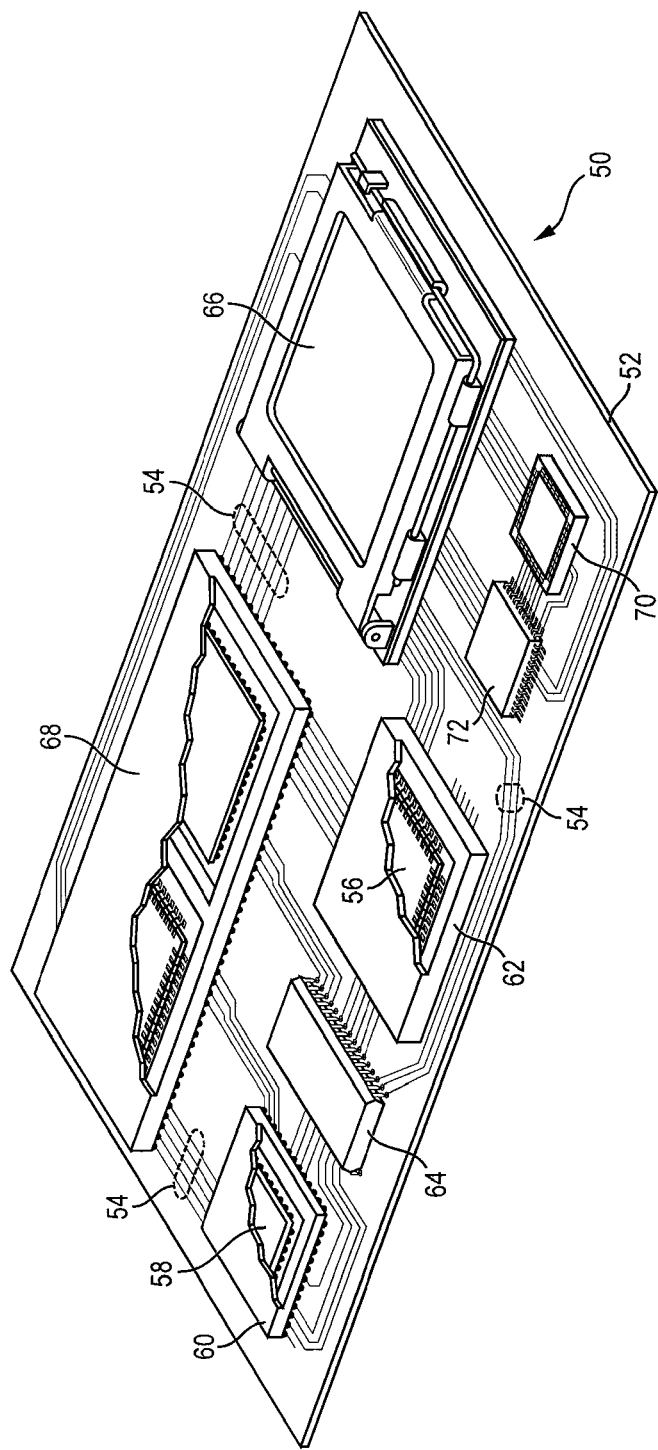
FIG. 2 illustrates a printed circuit board (PCB) with different types of packages mounted to its surface.

FIG. 2 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 2 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 2, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 3A:
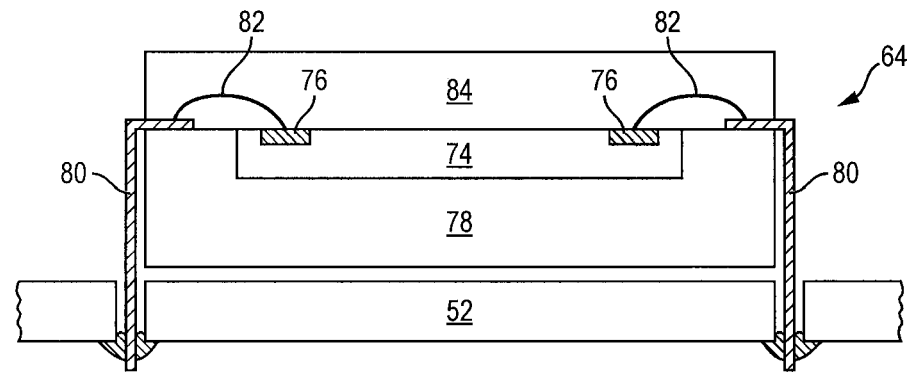
FIGS. 3a-3c illustrate further detail of the representative semiconductor packages mounted to the PCB.
Figure 3B:
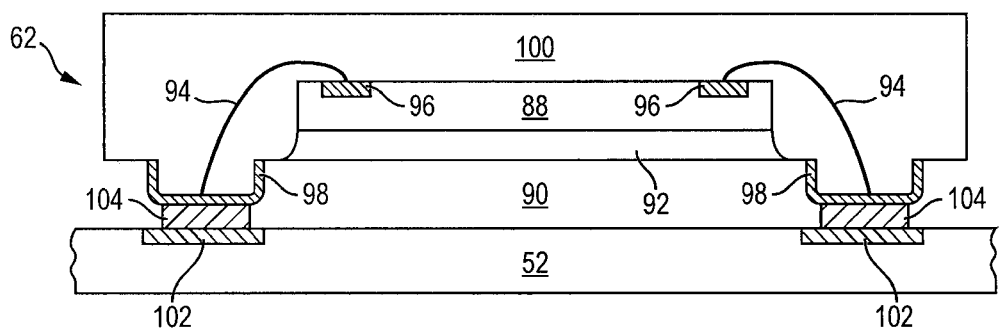
Figure 3C:
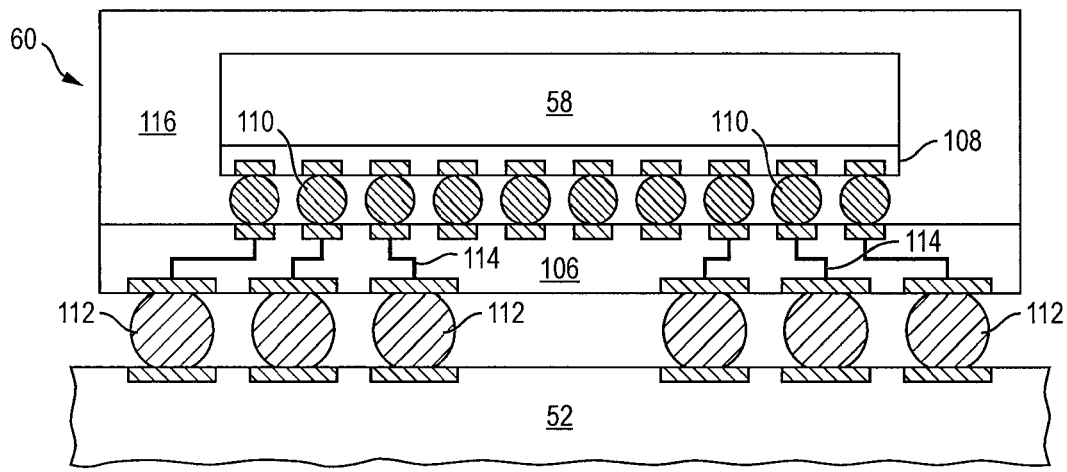

FIGS. 3a-3c show exemplary semiconductor packages. FIG. 3a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 3b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 3c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 4C:
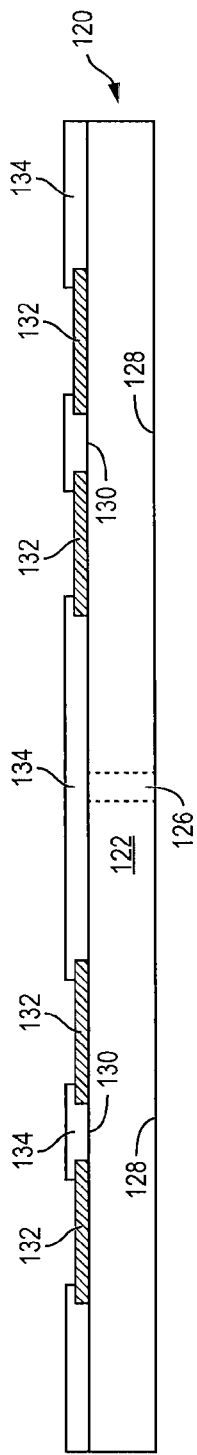

FIGS. 4a-4j illustrate, in relation to FIGS. 2 and 3a-3c, a process of forming an RDL over a contact pad with a high alignment tolerance. FIG. 4a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

FIG. 4b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flip-chip type die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124. Alternatively, contact pads 132 can be offset in multiple rows such that a first row of contact pads is disposed a first distance from the edge of the die, and a second row of contact pads alternating with the first row is disposed a second distance from the edge of the die.

In FIG. 4c, an insulating or passivation layer 134 is formed over active surface 130 and conductive layer 132 using PVD, CVD, printing, spin coating, spray coating, sintering or thermal oxidation. The insulating layer 134 contains one or more layers of silicon dioxide (SiO2), silicon nitride (Si3N4), silicon oxynitride (SiON), tantalum pentoxide (Ta2O5), aluminum oxide (Al2O3), benzocyclobutene (BCB), polyimide (PI), polybenzoxazoles (PBO), suitable dielectric material, or other material having similar insulating and structural properties. A portion of insulating layer 134 is removed by an etching process through a photoresist layer (not shown) to expose conductive layer 132.

Figure 4D:
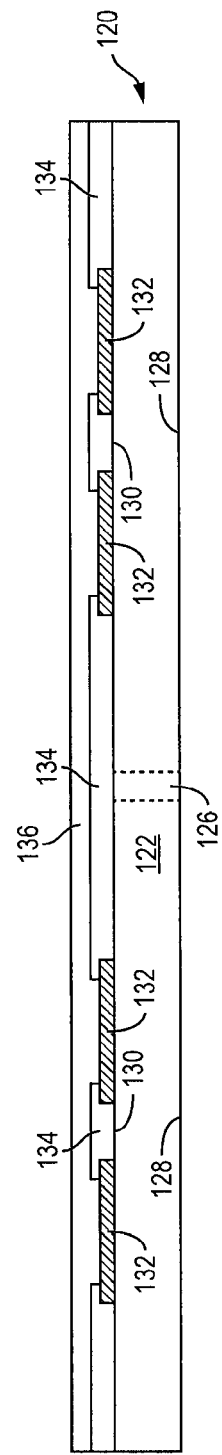
Figure 4E:
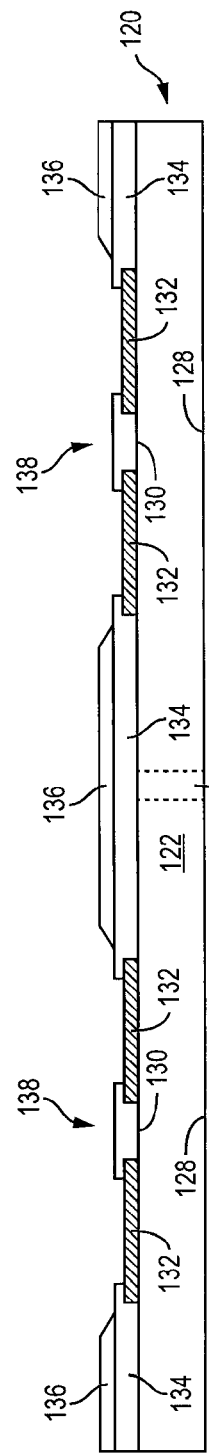

In FIG. 4d, an insulating or passivation layer 136 is formed over insulating layer 134 and the exposed conductive layer 132 using PVD, CVD, printing, spin coating, spray coating, sintering or thermal oxidation. The insulating layer 136 contains one or more layers of SiO2, Si3N4, SiON, Ta2O5, Al2O3, BCB, PI, PBO, suitable dielectric material, or other material having similar insulating and structural properties. A portion of insulating layer 136 is removed by an etching process through a photoresist layer to form openings 138 and fully expose conductive layer 132 with respect to insulating layer 136, as shown in FIG. 4e. That is, no portion of insulating layer 136 overlies conductive layer 132.

In one embodiment, a portion of insulating layer 136 is removed by subjecting irradiated DFR material to a developer which selectively dissolves non-irradiated portions of the DFR material to create patterned openings 138 in insulating layer 136 disposed over conductive layer 132, while leaving the irradiated portions of the photoresist material intact.

Alternatively, circular openings 138 can be formed by laser direct ablation (LDA) using laser 140 to remove portions of insulating layer 136 in applications requiring finer interconnect dimensions, as shown in FIG. 4f.

FIG. 4g shows a plan view of insulating layers 134 and 136 and conductive layer 132, with no portion of insulating layer 136 overlying conductive layer 132.

In FIG. 4h, an electrically conductive layer 142 is formed over the exposed conductive layer 132 and insulating layers 134 and 136 using a patterning and metal deposition process such as printing, PVD, CVD, sputtering, electrolytic plating, and electroless plating. Conductive layer 142 can be one or more layers of Al, Cu, Sn, Ni, Au, Ag, or other suitable electrically conductive material. Conductive layer 142 can be conformally applied to follow the contour of insulation layers 134 and 136 and conductive layer 132. Conductive layer 142 operates as an RDL electrically connected to conductive layer 132. Conductive layer 142 extends in a direction parallel to active surface 130, beyond opening 138 in insulating layer 136, to laterally redistribute the electrical interconnect to conductive layer 132.

Figure 4I:
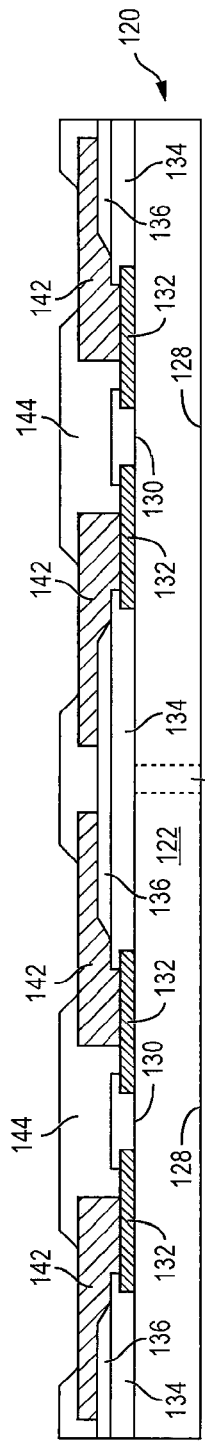

In FIG. 4i, an insulating or passivation layer 144 is formed over insulating layer 136 and conductive layer 142 using PVD, CVD, printing, spin coating, spray coating, sintering or thermal oxidation. The insulating layer 144 contains one or more layers of SiO2, Si3N4, SiON, Ta2O5, Al2O3, BCB, PI, PBO, suitable dielectric material, or other material having similar insulating and structural properties. A portion of insulating layer 144 is removed by an etching process through a photoresist layer to expose conductive layer 142 for electrical interconnect.

Figure 4J:
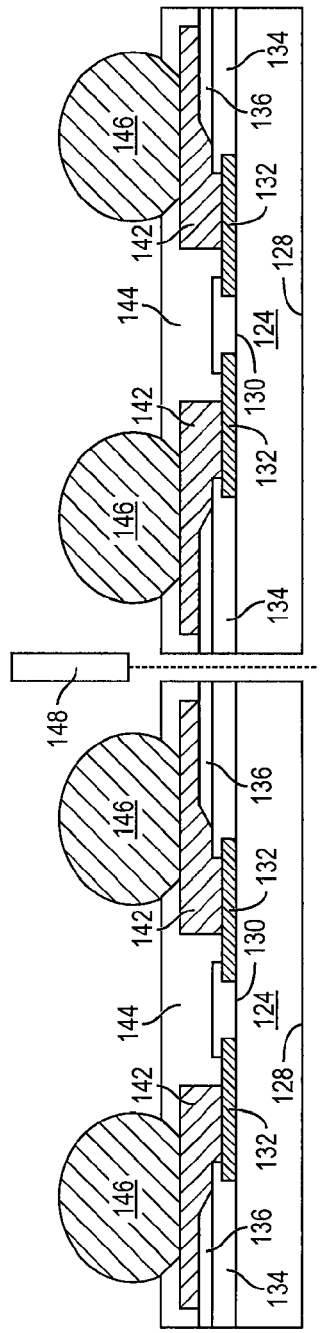

In FIG. 4j, an electrically conductive bump material is deposited over the exposed conductive layer 142 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 142 using a suitable attachment or bonding process. In one embodiment, the bump material is reflowed by heating the material above its melting point to form bumps 146. In some applications, bumps 146 are reflowed a second time to improve electrical contact to conductive layer 142. Bumps 146 can also be compression bonded to conductive layer 142. An under bump metallization (UBM) layer can be formed between bumps 146 and conductive layer 142. Bumps 146 represent one type of interconnect structure that can be formed over conductive layer 142. The interconnect structure can also use stud bump, micro bump, or other electrical interconnect.

Figure 5A:
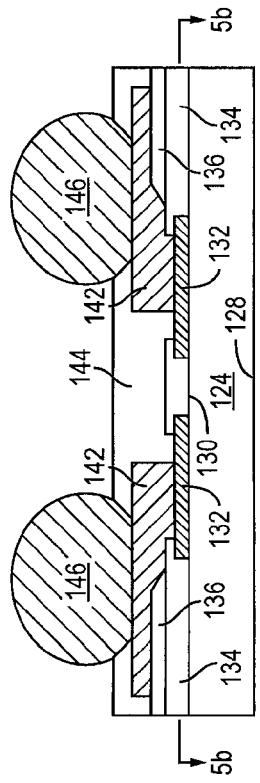
FIGS. 5a-5b illustrate the semiconductor die with the RDL formed over the contact pad.

Semiconductor wafer 120 is singulated through saw street 126 using a saw blade or laser cutting tool 148 into individual semiconductor die 124. FIG. 5a shows semiconductor die 124 after singulation. Semiconductor die 124 is electrically connected through conductive layers 132 and 142 to bumps 146. The opening 138 fully exposes conductive layer 132 with respect to insulating layer 136, so that no portion of insulating layer 136 overlies conductive layer 132. Conductive layer 142 is formed over portions of insulating layers 134 and 136 and the exposed conductive layer 132. Since insulating layer 136 does not overlap conductive layer 132, a greater separation between adjacent conductive layers 142 can be realized, without losing contact area between conductive layer 132 and conductive layer 142. The greater separation between adjacent conductive layers 142 increases alignment tolerance.

Figure 5B:
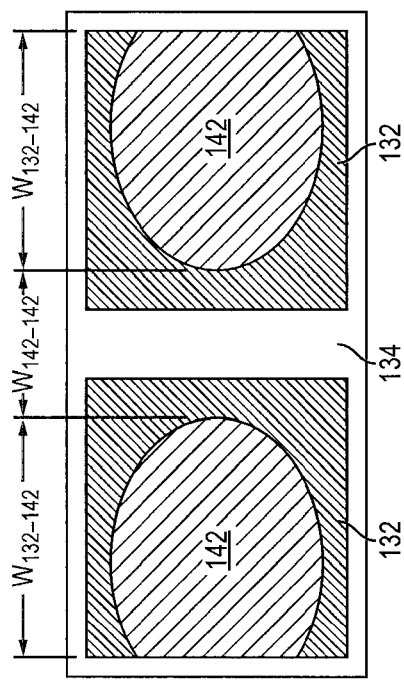

FIG. 5b shows a plan view of conductive layers 132 and 142 and insulating layer 134, taken along line 5b-5b of FIG. 5a. Conductive layer 142 extends over conductive layer 132 up to one side of insulating layer 134. In one embodiment, the width of conductive layer 132 is 45 μm, and the width between adjacent conductive layers 132 is 5 μm, providing a pitch for conductive layer 132 of 50 μm. The width of contact interface $W_{132-142}$ between conductive layer 132 and conductive layer 142 is at least 20 μm for good contact characteristics, e.g. low contact resistance. The width between adjacent conductive layers 142 $W_{142-142}$ is 30 μm. By increasing the size of opening 138 to fully expose conductive layer 132 with respect to insulating layer 136, a high alignment tolerance is achieved for conductive layer 142 without sacrificing the contact interface $W_{132-142}$.

Figure 6A:
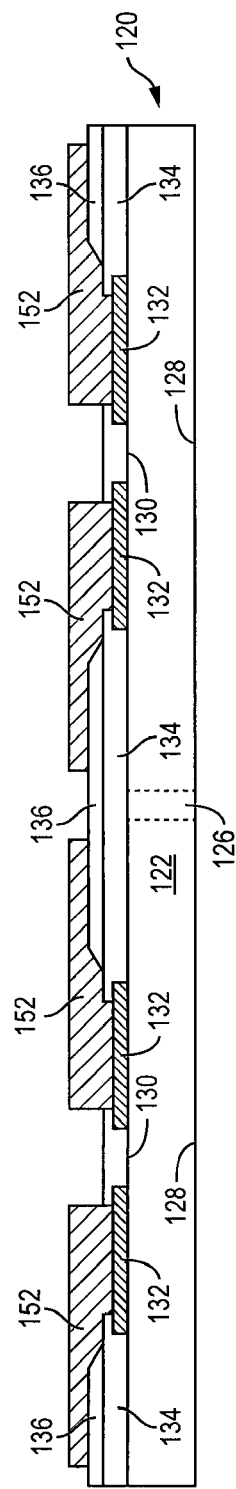
FIGS. 6a-6c illustrate a process of forming an RDL over a contact pad with reduced interconnect pitch.
Figure 6B:
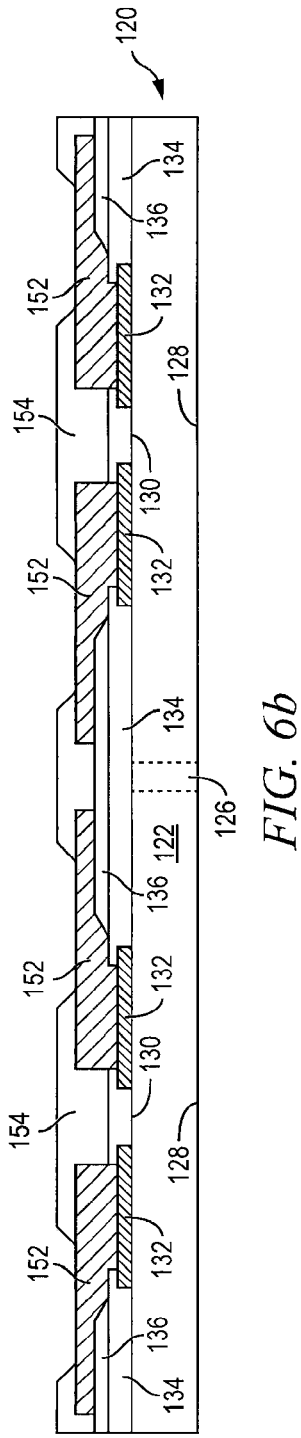
Figure 6C:
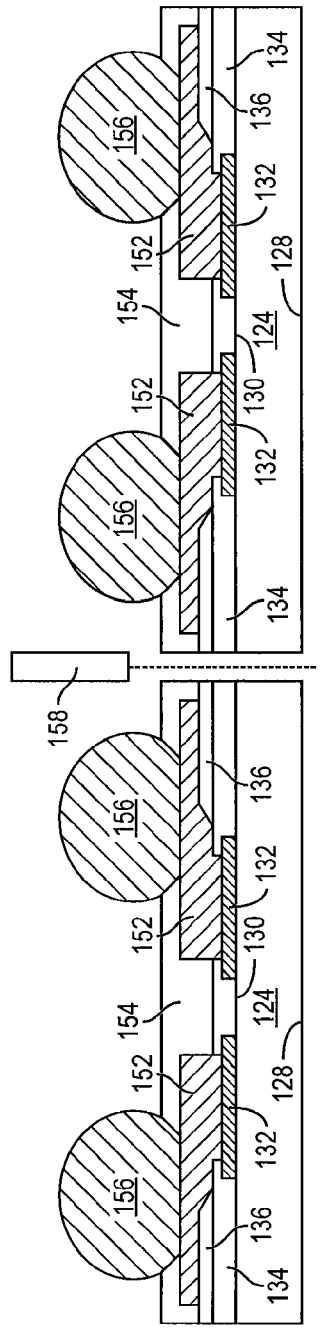

FIGS. 6a-6c illustrate, in relation to FIGS. 2 and 3a-3c, a process of forming an RDL over a contact pad with reduced interconnect pitch. Continuing from FIG. 4g, an electrically conductive layer 152 is formed over the exposed conductive layer 132 and insulating layers 134 and 136 using a patterning and metal deposition process such as printing, PVD, CVD, sputtering, electrolytic plating, and electroless plating, as shown in FIG. 6a. Conductive layer 152 can be one or more layers of Al, Cu, Sn, Ni, Au, Ag, or other suitable electrically conductive material. Conductive layer 152 can be conformally applied to follow the contour of insulation layers 134 and 136 and conductive layer 132 and, in this embodiment, extends completely across conductive layer 132 up to insulating layer 134 on opposite sides of conductive layer 132. Conductive layer 152 operates as an RDL electrically connected to conductive layer 132. Conductive layer 152 extends in a direction parallel to active surface 130, beyond opening 138 in insulating layer 136, to laterally redistribute the electrical interconnect to conductive layer 132.

In FIG. 6b, an insulating or passivation layer 154 is formed over insulating layer 136 and conductive layer 152 using PVD, CVD, printing, spin coating, spray coating, sintering or thermal oxidation. The insulating layer 154 contains one or more layers of SiO2, Si3N4, SiON, Ta2O5, Al2O3, BCB, PI, PBO, suitable dielectric material, or other material having similar insulating and structural properties. A portion of insulating layer 154 is removed by an etching process through a photoresist layer to expose conductive layer 152 for electrical interconnect.

In FIG. 6c, an electrically conductive bump material is deposited over the exposed conductive layer 152 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 152 using a suitable attachment or bonding process. In one embodiment, the bump material is reflowed by heating the material above its melting point to form bumps 156. In some applications, bumps 156 are reflowed a second time to improve electrical contact to conductive layer 152. Bumps 156 can also be compression bonded to conductive layer 152. A UBM layer can be formed between bumps 156 and conductive layer 152. Bumps 156 represent one type of interconnect structure that can be formed over conductive layer 152. The interconnect structure can also use stud bump, micro bump, or other electrical interconnect.

Figure 7A:
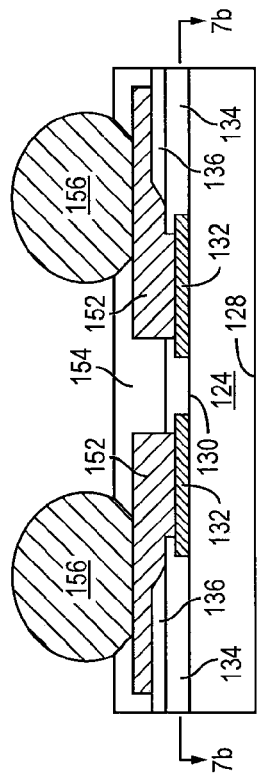

Semiconductor wafer 120 is singulated through saw street 126 using a saw blade or laser cutting tool 158 into individual semiconductor die 124. FIG. 7a shows semiconductor die 124 after singulation. Semiconductor die 124 is electrically connected through conductive layers 132 and 152 to bumps 156. The opening 138 fully exposes conductive layer 132 with respect to insulating layer 136, so that no portion of insulating layer 136 overlies conductive layer 132. Conductive layer 152 is formed over portions of insulating layers 134 and 136 and the exposed conductive layer 132. Since insulating layer 136 does not overlap conductive layer 132, the contact area between conductive layer 132 and conductive layer 152 is maintained while the width of conductive layer 132 is reduced to decrease the interconnect pitch.

FIG. 7b shows a plan view of conductive layers 132 and 152 and insulating layer 134, taken along line 7b-7b of FIG. 7a. Conductive layer 152 extends over conductive layer 132 between opposing sides of insulating layer 134. In one embodiment, the width of conductive layer 132 is 25 μm, and the width between adjacent conductive layers 132 is 5 μm, providing a pitch for conductive layer 132 of 30 μm. The pitch of conductive layer 132 can range from 30-50 μm. The width of contact interface $W_{132-152}$ between conductive layer 132 and conductive layer 152 is at least 20 μm for good contact characteristics, e.g. low contact resistance. The smaller width of conductive layer 132 reduces interconnect pitch. By increasing the size of opening 138 to fully expose conductive layer 132 with respect to insulating layer 136 and extending conductive layer 152 completely over conductive layer 132 up to insulating layer 134 on opposite sides of conductive layer 132, the width and pitch of conductive layer 132 are reduced without sacrificing the contact interface $W_{132-152}$.

FIG. 8 illustrates an embodiment of semiconductor die 124, similar to FIG. 7a, without insulating layer 136. The insulating layer 136 can be omitted in case where insulating layer 134 is a dielectric material.

FIGS. 9a-9b illustrate, in relation to FIGS. 2 and 3a-3c, another process of forming an RDL over a contact pad with a high alignment tolerance and reduced interconnect pitch. Continuing from FIG. 4g, an electrically conductive layer 162 is formed over the exposed conductive layer 132 and insulating layers 134 and 136 using a patterning and metal deposition process such as printing, PVD, CVD, sputtering, electrolytic plating, and electroless plating, as shown in FIG. 9a. Conductive layer 162 can be one or more layers of Al, Cu, Sn, Ni, Au, Ag, or other suitable electrically conductive material. Conductive layer 162 can be conformally applied to follow the contour of insulation layers 134 and 136 and conductive layer 132 and, in this embodiment, extends over conductive layer 132 up to one side of insulating layer 134. Conductive layer 162 operates as an RDL electrically connected to conductive layer 132. Conductive layer 162 extends in a direction parallel to active surface 130 and perpendicular to the adjacent conductive layer 132, beyond opening 138 in insulating layer 136, to laterally redistribute the electrical interconnect to conductive layer 132.

In FIG. 9b, an insulating or passivation layer 164 is formed over insulating layer 136 and conductive layer 162 using PVD, CVD, printing, spin coating, spray coating, sintering or thermal oxidation. The insulating layer 164 contains one or more layers of $SiO_2$, $Si_3N_4$, SiON, $Ta_2O_5$, $Al_2O_3$, BCB, PI, PBO, suitable dielectric material, or other material having similar insulating and structural properties.

Semiconductor wafer 120 is singulated through saw street 126 using a saw blade or laser cutting tool 168 into individual semiconductor die 124. FIG. 10a shows semiconductor die 124 after singulation. Semiconductor die 124 is electrically connected to conductive layers 132 and 162. The opening 138 fully exposes conductive layer 132 with respect to insulating layer 136, so that no portion of insulating layer 136 overlies conductive layer 132. Conductive layer 162 is formed over insulating layers 134 and 136 and the exposed conductive layer 132. Since insulating layer 136 does not overlap conductive layer 132 and conductive layer 162 extends in a direction perpendicular to the adjacent conductive layer 132, a greater separation is realized between adjacent conductive layers 162, without losing contact area between conductive layer 132 and conductive layer 162. The greater separation between adjacent conductive layers 162 provides a high alignment tolerance. In addition, the width of conductive layer 132 can be reduced for a smaller interconnect pitch.

Figure 10B:
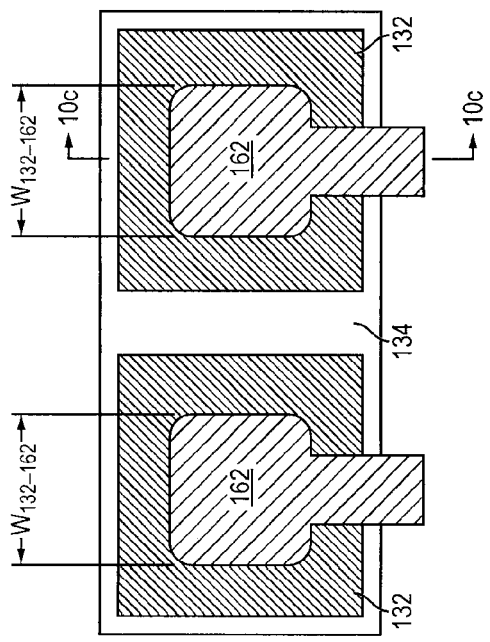

FIG. 10b shows a plan view of conductive layers 132 and 162 and insulating layer 134. Conductive layer 162 extends over conductive layer 132 up to one side of insulating layer 134. In one embodiment, the width of conductive layer 132 is 25 µm, and the width between adjacent conductive layers 132 is 5 µm, providing a pitch for conductive layer 132 of 30 µm. The pitch of conductive layer 132 can range from 30-50 µm. The width of contact interface $W_{132-162}$ between conductive layer 132 and conductive layer 162 is at least 20 µm for good contact characteristics, e.g. low contact resistance. The smaller width of conductive layer 132 reduces the interconnect pitch. By increasing the size of opening 138 to fully expose conductive layer 132 with respect to insulating layer 136 and by extending conductive layer 162 in a direction perpendicular to the adjacent conductive layer 132, the width and pitch of conductive layer 132 is reduced without sacrificing the contact interface $W_{132-162}$. A high alignment tolerance of conductive layer 162 is achieved with the spacing between conductive layers 162.

Figure 10C:
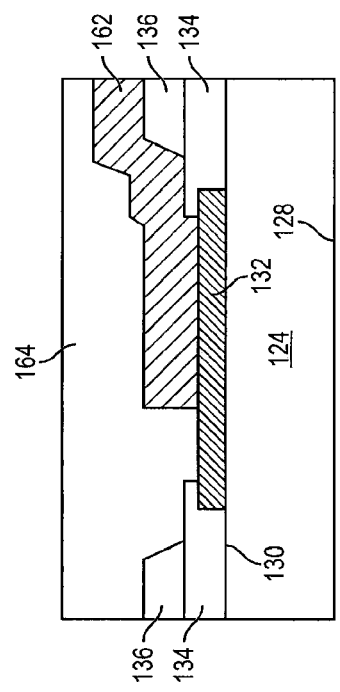

FIG. 10c shows a cross sectional view of conductive layers 132, conformally applied conductive layer 162, and insulating layers 134, 136, and 164, taken along line 10c-10c of FIG. 10b.

Figure 11A:
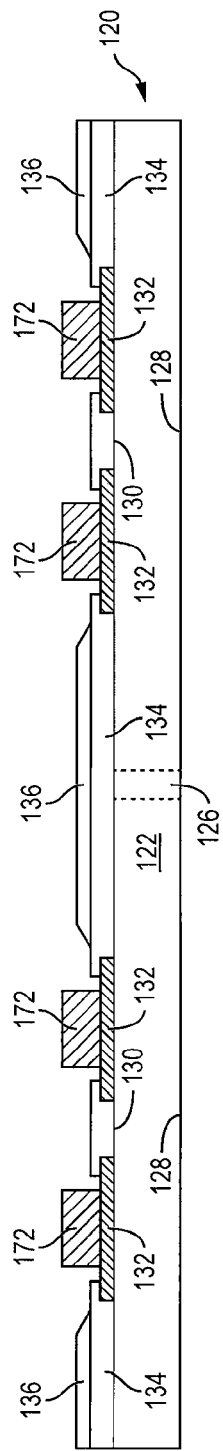
FIGS. 11a-11b illustrate another process of forming an RDL over a contact pad with a high alignment tolerance and reduced interconnect pitch.
Figure 11B:
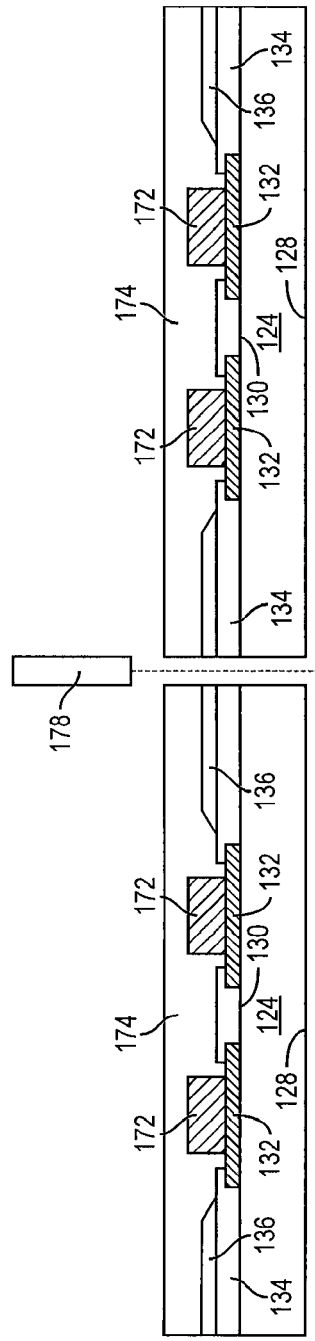

FIGS. 11a-11b illustrate, in relation to FIGS. 2 and 3a-3c, another process of forming an RDL over a contact pad with a high alignment tolerance and reduced interconnect pitch. Continuing from FIG. 4g, an electrically conductive layer 172 is formed over the exposed conductive layer 132 and insulating layers 134 and 136 using a patterning and metal deposition process such as printing, PVD, CVD, sputtering, electrolytic plating, and electroless plating, as shown in FIG. 11a. Conductive layer 172 can be one or more layers of Al, Cu, Sn, Ni, Au, Ag, or other suitable electrically conductive material. Conductive layer 172 can be conformally applied to follow the contour of insulation layers 134 and 136 and conductive layer 132 and, in this embodiment, extends completely across conductive layer 132 up to insulating layer 134 on opposite sides of conductive layer 132. Conductive layer 172 operates as an RDL electrically connected to conductive layer 132. Conductive layer 172 extends in a direction parallel to active surface 130 and perpendicular to the adjacent conductive layer 132, beyond opening 138 in insulating layer 136, to laterally redistribute the electrical interconnect to conductive layer 132.

In FIG. 11b, an insulating or passivation layer 174 is formed over insulating layer 136 and conductive layer 172 using PVD, CVD, printing, spin coating, spray coating, sintering or thermal oxidation. The insulating layer 174 contains one or more layers of $SiO_2$, $Si_3N_4$, SiON, $Ta_2O_5$, $Al_2O_3$, BCB, PI, PBO, suitable dielectric material, or other material having similar insulating and structural properties.

Figure 12A:
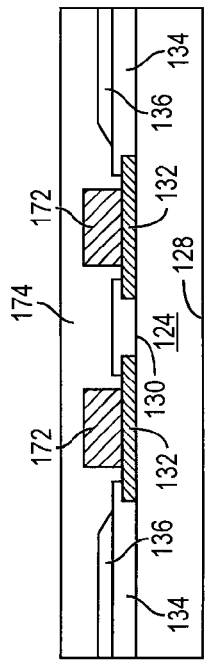
FIGS. 12a-12c illustrate the semiconductor die with the RDL over the contact pad according to FIGS. 11a-11b.

Semiconductor wafer 120 is singulated through saw street 126 using a saw blade or laser cutting tool 178 into individual semiconductor die 124. FIG. 12a shows semiconductor die 124 after singulation. Semiconductor die 124 is electrically connected to conductive layers 132 and 172. The opening 138 fully exposes conductive layer 132 with respect to insulating layer 136, so that no portion of insulating layer 136 overlies conductive layer 132. Conductive layer 172 is formed over insulating layers 134 and 136 and the exposed conductive layer 132. Since insulating layer 136 does not overlap conductive layer 132 and conductive layer 172 extends in a direction perpendicular to the adjacent conductive layer 132, a greater separation is realized between adjacent conductive layers 172, without losing contact area between conductive layer 132 and conductive layer 172. The greater separation between adjacent conductive layers 172 provides a high alignment tolerance. In addition, the width of conductive layer 132 can be reduced for a smaller interconnect pitch.

Figure 12B:
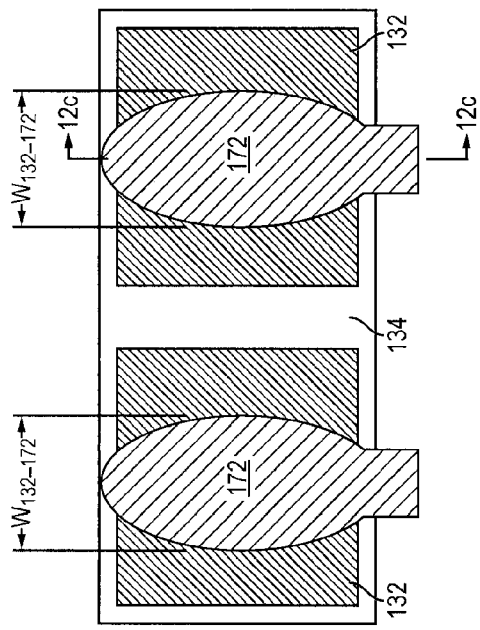

FIG. 12b shows a plan view of conductive layers 132 and 172 and insulating layer 134. Conductive layer 172 extends over conductive layer 132 between opposing sides of insulating layer 134. In one embodiment, the width of conductive layer 132 is 25 µm, and the width between adjacent conductive layers 132 is 5 µm, providing a pitch for conductive layer 132 of 30 µm. The pitch of conductive layer 132 can range from 30-50 µm. The width of contact interface $W_{132-172}$ between conductive layer 132 and conductive layer 172 is at least 20 µm for good contact characteristics, e.g. low contact resistance. The smaller width of conductive layer 132 reduces the interconnect pitch. By increasing the size of opening 138 to fully expose conductive layer 132 with respect to insulating layer 136 and extending conductive layer 172 completely over conductive layer 132 up to insulating layer 134 on opposite sides of conductive layer 132 in a direction perpendicular to the adjacent conductive layer 132, the width and pitch of conductive layer 132 is reduced without sacrificing the contact interface $W_{132\text{-}172}$. A high alignment tolerance of conductive layer 172 is achieved with the spacing between conductive layers 172.

Figure 12C:
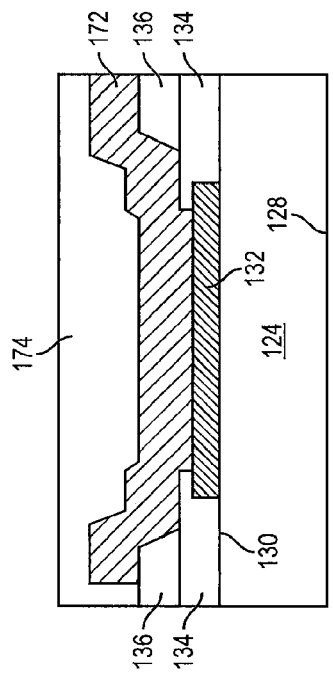

FIG. 12c shows a cross sectional view of conductive layers 132, conformally applied conductive layer 172, and insulating layers 134, 136, and 174, taken along line 12c-12c of FIG. 12b.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor die including an active surface;
   forming a first conductive layer over the active surface of the semiconductor die;
   forming a first insulating layer over the active surface of the semiconductor die;
   forming a second insulating layer over the first insulating layer and first conductive layer;
   removing a portion of the second insulating layer over the first conductive layer so that no portion of the second insulating layer overlies the first conductive layer;
   forming a second conductive layer over a portion of the first conductive layer and over the first and second insulating layers and including a width over the first conductive layer that is less than a width of the first conductive layer; and
   forming a third insulating layer over the second conductive layer and first and second insulating layers.

2. The method of claim 1, wherein the second conductive layer extends over the first conductive layer up to the first insulating layer.

3. The method of claim 1, wherein the second conductive layer extends across the first conductive layer up to the first insulating layer on opposite sides of the first conductive layer.

4. The method of claim 1, wherein the second conductive layer extends across the first conductive layer up to the first insulating layer on opposite sides of the first conductive layer in a direction perpendicular to an adjacent first conductive layer.

5. The method of claim 1, wherein a contact interface between the first conductive layer and second conductive layer is at least 20 micrometers.

6. The method of claim 1, wherein a pitch of the first conductive layer ranges from 30-50 micrometers.

7. A method of making a semiconductor device, comprising:
   providing a semiconductor die;
   forming a first conductive layer over a surface of the semiconductor die;
   forming a first insulating layer over the first conductive layer and over the semiconductor die;
   forming a second insulating layer over the first conductive layer and first insulating layer;
   removing a portion of the second insulating layer over the first conductive layer so that no portion of the second insulating layer overlies the first conductive layer; and
   forming a second conductive layer over the first insulating layer and a portion of the first conductive layer.

8. The method of claim 7, further including forming a third insulating layer over the second conductive layer.

9. The method of claim 7, wherein the second conductive layer extends over the first conductive layer up to the first insulating layer.

10. The method of claim 7, wherein the second conductive layer extends across the first conductive layer up to the first insulating layer on opposite sides of the first conductive layer.

11. The method of claim 7, wherein the second conductive layer extends across the first conductive layer up to the second insulating layer on opposite sides of the first conductive layer in a direction perpendicular to an adjacent first conductive layer.

12. The method of claim 7, wherein a contact interface between the first conductive layer and second conductive layer is at least 20 micrometers.

13. The method of claim 7, wherein a pitch of the first conductive layer ranges from 30-50 micrometers.

14. A method of making a semiconductor device, comprising:
   providing a semiconductor die;
   forming a first conductive layer over the semiconductor die;
   forming a first insulating layer over the semiconductor die;
   forming an opening in the first insulating layer over the first conductive layer such that no portion of the first insulating layer overlies the first conductive layer; and
   forming a second conductive layer over the first conductive layer, the second conductive layer including a width over the first conductive layer that is less than a width of the first conductive layer.

15. The method of claim 14, further including forming a second insulating layer over the semiconductor die and the first conductive layer.

16. The method of claim 15, wherein the second conductive layer extends over the first conductive layer up to the second insulating layer.

17. The method of claim 15, wherein the second conductive layer extends across the first conductive layer up to the second insulating layer on opposite sides of the first conductive layer in a direction perpendicular to an adjacent first conductive layer.

18. The method of claim 14, wherein a contact interface between the first conductive layer and second conductive layer is at least 20 micrometers.

19. The method of claim 14, wherein a pitch of the first conductive layer ranges from 30-50 micrometers.

20. A semiconductor device, comprising:
   a semiconductor die;
   a first conductive layer formed over a surface of the semiconductor die;
   a first insulating layer formed over the first conductive layer and over the surface of the semiconductor die; and
   a second conductive layer electrically connected to and extending across the first conductive layer up to a first side of the first insulating layer without extending past the first side of the first insulating layer.

21. The semiconductor device of claim 20, further including a second insulating layer formed over the first insulating layer, wherein no portion of the second insulating layer overlies the first conductive layer.

22. The semiconductor device of claim 20, wherein the second conductive layer extends across the first conductive layer up to the first insulating layer on opposite sides of the first conductive layer in a direction perpendicular to an adjacent first conductive layer.

23. The semiconductor device of claim 20, wherein a contact interface between the first conductive layer and second conductive layer is at least 20 micrometers.

24. The semiconductor device of claim 20, wherein a pitch of the first conductive layer ranges from 30-50 micrometers.

25. A semiconductor device, comprising:
- a semiconductor die;
- a first conductive layer formed over the semiconductor die;
- a first insulating layer formed over the semiconductor die such that no portion of the first insulating layer overlies the first conductive layer; and
- a second conductive layer formed over the first conductive layer and in an opening in the first insulating layer.

26. The semiconductor device of claim 25, further including a second insulating layer formed over the first conductive layer.

27. The semiconductor device of claim 25, further including a second insulating layer formed over the second conductive layer.

28. The semiconductor device of claim 25, wherein the second conductive layer includes a width over the first conductive layer that is less than a width of the first conductive layer.

29. The semiconductor device of claim 25, further including a second insulating layer formed over the semiconductor die and first conductive layer.

30. The semiconductor device of claim 25, wherein a pitch of the first conductive layer ranges from 30-50 micrometers.

* * * * *